(12) United States Patent
Kimura et al.

(10) Patent No.: US 11,908,659 B2
(45) Date of Patent: Feb. 20, 2024

(54) MULTI CHARGED PARTICLE BEAM WRITING APPARATUS

(71) Applicant: NuFlare Technology, Inc., Yokohama (JP)

(72) Inventors: Toshiki Kimura, Yokohama (JP); Hirofumi Morita, Setagaya-ku (JP); Takanao Touya, Kawasaki (JP); Mitsuhiro Okazawa, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 71 days.

(21) Appl. No.: 17/805,887

(22) Filed: Jun. 8, 2022

(65) Prior Publication Data

US 2022/0399181 A1    Dec. 15, 2022

(30) Foreign Application Priority Data

Jun. 14, 2021 (JP) ................................ 2021-098831
Apr. 21, 2022 (JP) ................................ 2022-070232

(51) Int. Cl.
- *H01J 37/317* (2006.01)
- *H01J 37/09* (2006.01)
- *H01J 37/04* (2006.01)

(52) U.S. Cl.
CPC ........ *H01J 37/3177* (2013.01); *H01J 37/045* (2013.01); *H01J 37/09* (2013.01); *H01J 2237/0435* (2013.01)

(58) Field of Classification Search
CPC ...... H01J 37/3177; H01J 37/045; H01J 37/09; H01J 37/14; H01J 37/1413; H01J 37/143; H01J 37/145; H01J 2237/0435; H01J 2237/045; H01J 2237/0451; H01J 2237/0453; H01J 2237/1415; H01J 2237/026; H01J 2237/0264; H01J 2237/0268

See application file for complete search history.

(56) References Cited

U.S. PATENT DOCUMENTS

| | | | |
|---|---|---|---|
| 2013/0078577 A1 | 3/2013 | Yamazaki | |
| 2017/0110288 A1 | 4/2017 | Matsumoto | |
| 2018/0277334 A1* | 9/2018 | Van Veen | ................ H01J 37/09 |

FOREIGN PATENT DOCUMENTS

| | | |
|---|---|---|
| JP | 2009-288484 A | 12/2009 |
| JP | 2013-074088 A | 4/2013 |
| JP | 2017-079259 A | 4/2017 |

* cited by examiner

*Primary Examiner* — Sean M Luck
(74) *Attorney, Agent, or Firm* — Oblon, McClelland, Maier & Neustadt, L.L.P.

(57) ABSTRACT

In one embodiment, a multi charged particle beam writing apparatus includes a blanking aperture array substrate provided with a plurality of blankers configured to respectively perform blanking deflection on a plurality of charged particle beams included in a multi-beam, and a first shield member which is disposed downstream of the blanking aperture array substrate with respect to a travel direction of the multi-beam, has a cylindrical part in which the multi-beam passes through, and is composed of a high magnetic permeability material.

16 Claims, 4 Drawing Sheets

MULTI CHARGED PARTICLE BEAM WRITING APPARATUS

CROSS REFERENCE TO RELATED APPLICATION

This application is based upon and claims benefit of priority from the Japanese Patent Application No. 2021-098831, filed on Jun. 14, 2021, and the Japanese Patent Application No. 2022-070232, filed on Apr. 21, 2022, the entire contents of which are incorporated herein by reference.

FIELD

The present invention relates to a multi charged particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus that uses a multi-beam can irradiate with many beams at one time, as compared with when writing is performed with a single electron beam, thus the throughput can be significantly improved. In a multi-beam writing apparatus using a blanking aperture array substrate according to an embodiment of the multi-beam writing apparatus, an electron beam discharged from an electron gun passes through a shaping aperture array having a plurality of openings, thus a multi-beam (a plurality of electron beams) is formed. The multi-beam passes through corresponding blankers of the blanking aperture array substrate. The blanking aperture array substrate has electrode pairs each for independently deflecting a beam, and an opening for beam passage between each electrode pair. Blanking control is independently performed on a passing electron beam by fixing one of each electrode pair (blanker) to the ground potential and switching the other electrode between the ground potential and other potential. Electron beams that are deflected by the blankers are shielded, and a sample is irradiated with electron beams that are not deflected.

In a multi-beam writing apparatus in related art, due to the effect of a magnetic field generated by a current which flows through the blanking aperture array substrate, the beam trajectory is slightly bent, and the beam irradiation position on the sample surface is displaced, thus the writing accuracy may be degraded.

DETAILED DESCRIPTION

In one embodiment, a multi charged particle beam writing apparatus includes a blanking aperture array substrate provided with a plurality of blankers configured to respectively perform blanking deflection on a plurality of charged particle beams included in a multi-beam, and a first shield member which is disposed downstream of the blanking aperture array substrate with respect to a travel direction of the multi-beam, has a cylindrical part in which the multi-beam passes through, and is composed of a high magnetic permeability material.

In a charged particle beam writing apparatus, shields are often arranged around a column to shield magnetism from the outside. However, in a multi-beam writing apparatus, it is necessary to shield the magnetic field from a control circuit of the blanking aperture array substrate inside the column, the control circuit essentially needed for a multi-beam writing operation. Therefore, a general magnetic shield forming method such as simply covering with a magnetic body is insufficient, and it is required that a beam passage area is secured, and space is provided for installing an electric wire to operate the blanking aperture array substrate, between the blanking aperture array substrate and a column wall surface connector. Securing the beam passage area and the space for wiring in this manner is against general magnetic shield design guidelines which state that covering should be made as much as possible. It is necessary to determine the configuration and arrangement of shielding in consideration of the effect on the beam instead of simply shielding the magnetic shield as much as possible. A specific configuration will be described below with reference to the drawings.

In an embodiment of the present invention below, a configuration using an electron beam as an example of a charged particle beam will be described. The charged particle beam is not limited to the electron beam. For example, the charged particle beam may be an ion beam.

Figure 1:
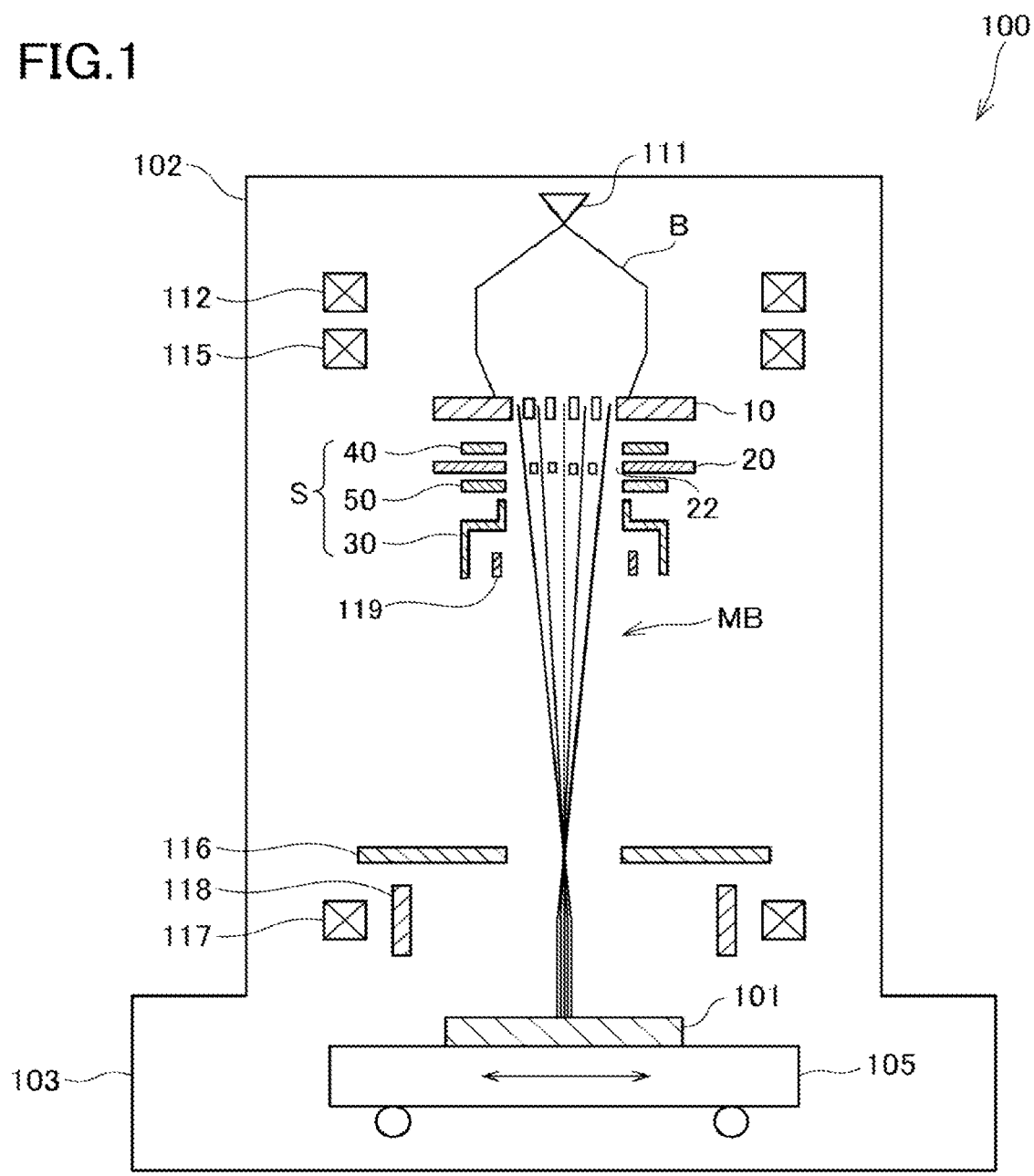
FIG. 1 is a schematic diagram of a multi charged particle beam writing apparatus according to an embodiment of the present invention.

FIG. 1 is a schematic diagram of a writing apparatus according to an embodiment. A writing apparatus 100 illustrated in FIG. 1 is an example of a multi charged particle beam writing apparatus. The writing apparatus 100 includes an electron column 102 and a writing chamber 103. In the electron column 102, an electron gun 111, an illuminating lens 112, a shaping aperture array substrate 10, a blanking aperture array substrate 20, a shield member S, a reducing lens 115, a limiting aperture member 116, an object lens 117, a deflector 118, and an overall blanker 119 are disposed.

The blanking aperture array substrate 20 includes a blanking aperture array chip (BAA chip) provided with blankers which perform blanking on the beams in the multi-beam, and a mounting substrate on which the BAA chip is mounted. The BAA chip and the mounting substrate are connected by wire bonding, for example. The mounting substrate is provided with a control circuit including a relay circuit for data transfer and a circuit element for power supply stabilization. The shield member S shields the magnetic field generated by a current which flows through the control circuit.

The shield member S has at least a first shield member 30. The shield member S may have two or more shield members. FIG. 1 illustrates a configuration further having a second shield member 40 and a third shield member 50. A metal fixing component is brought into contact with the front and back of the mounting substrate of the blanking aperture array substrate 20 while avoiding contact with the electronic parts mounted on the mounting substrate of the blanking aperture array substrate 20, and the first shield member 30, the second shield member 40 and the third shield member 50 are fixed by a screw to a fixing hole which is opened in the mounting substrate and the metal fastening component. The shield member S is composed of a high magnetic permeability material capable of absorbing magnetic flux, and prevents a magnetic field from affecting the beam trajectory, the magnetic field being generated by a current which flows through the blanking aperture array substrate 20. For the high magnetic permeability material, alloy containing iron, nickel or cobalt having a relative magnetic permeability of 1 or more may be used, and for instance, permalloy may be used.

An XY stage 105 is placed in the writing chamber 103. On the XY stage 105, a sample 101 such as a mask is placed, which serves as a writing target substrate at the time of writing. The sample 101 includes a mask for exposure at the time of manufacturing a semiconductor device, and a semiconductor substrate (silicon wafer) on which a semiconductor device is manufactured. In addition, the sample 101 includes a mask blank to which a resist is applied and on which nothing has been written yet.

Figure 2:
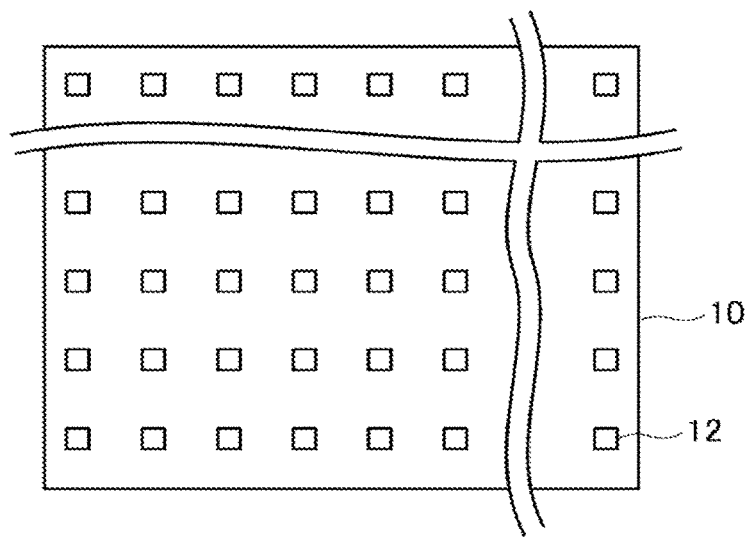
FIG. 2 is a plan view of a shaping aperture array substrate.

As illustrated in FIG. 2, in the shaping aperture array substrate 10, openings 12 with m vertical rows×n horizontal rows m, n≥2) are formed with a predetermined arrangement pitch. The openings 12 are formed as rectangles in the same dimensional shape. The shape of the openings 12 may be circular. A multi-beam MB is formed by part of electron beam B passing through the plurality of openings 12.

The blanking aperture array substrate 20 is provided below the shaping aperture array substrate 10. In the BAA chip of the blanking aperture array substrate 20, passage holes 22 are formed according to the arrangement positions of the openings 12 of the shaping aperture array substrate 10. On the lower surface side (or the upper surface side) of the BAA chip, blankers are disposed, which consist of sets of a pair of two blanking electrodes (not illustrated) in the vicinity of each passage hole 22. One of the blanking electrodes is fixed to the ground potential, and the other is switched between the ground potential and another potential.

A desired potential can be applied to each blanking electrode by the control circuit provided in the mounting substrate.

An electron beam passing through each passage hole 22 is independently deflected by a voltage applied to a corresponding blanker. In this manner, a plurality of blankers perform blanking deflection on corresponding individual beams of the multi-beam MB which has passed through the plurality of openings 12 of the shaping aperture array substrate 10.

The first shield member 30 is disposed below (downstream of the beam travel direction) the blanking aperture array substrate 20.

Figure 3A:
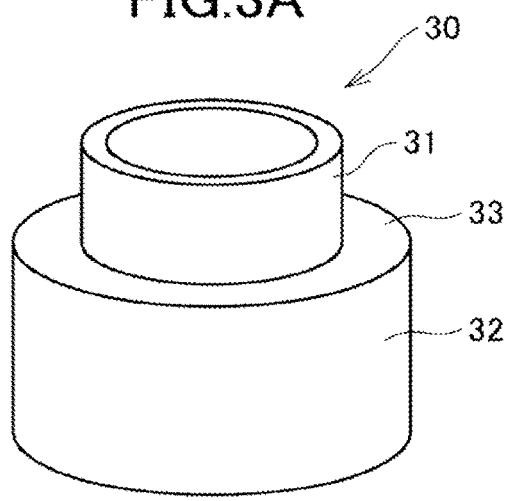
FIG. 3A is a perspective view of a first shield member.
Figure 3B:
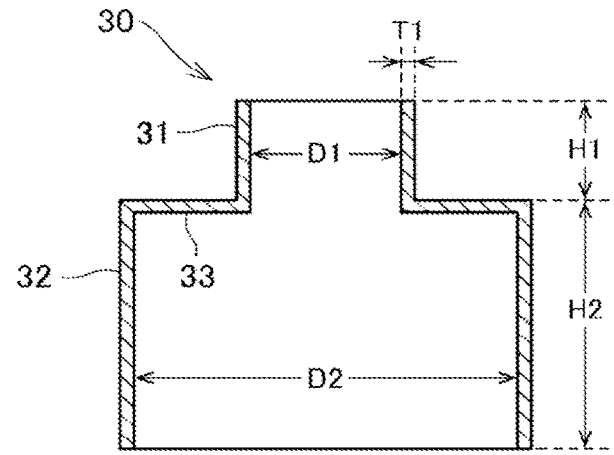
FIG. 3B is a longitudinal sectional view of the first shield member.

As illustrated in FIG. 3A, FIG. 3B, the first shield member 30 has a first cylindrical part 31. In addition, a second cylindrical part 32 greater in diameter than the first cylindrical part 31 may be connected to the first cylindrical part 31 via a connection member 33. The first cylindrical part 31 is positioned (on the upper side) near the blanking aperture array substrate 20, and the second cylindrical part 32 is located on the lower side. The first cylindrical part 31 and the second cylindrical part 32 are positioned on the same axis. The axial direction of the first cylindrical part 31 and the second cylindrical part 32 is parallel to the travel direction of the multi-beam MB.

A beam path is present at the center of the first shield member 30. The first shield member 30A preferably has a cylindrical shape having a certain length to prevent a magnetic field from entering the beam path, the magnetic field leaking from the blanking aperture array substrate 20.

The connection member 33 connects the lower edge of the first cylindrical part 31 and the upper edge of the second cylindrical part 32, and reduces the diameter of the first shield member 30. In the example illustrated in FIG. 3A, FIG. 3B, the connection member 33 has an annular shape which extends in a direction perpendicular to the circumferential lateral surface of the first cylindrical part 31 and the circumferential lateral surface of the second cylindrical part 32. However, the connection member 33 may be an inclined plane having a diameter which gradually decreases upward.

When the shape (beam shape) of the entire multi-beam MB is, for instance, a square, let the length of each side be D0, then the inner diameter D1 of the first cylindrical part 31 is preferably I2 times D0 or more and five times D0 or less so that the inner diameter D1 is slightly larger than the circumscribed circle of the beam shape.

The height H1 of the first cylindrical part 31 of the first shield member 30 is preferably the inner diameter D1 or more, and may be, for instance, three times D1 or four times D1.

The thickness T1 of the first cylindrical part 31, the second cylindrical part 32 and the connection member 33 is not particularly limited, and may have a dimension that can shield the magnetic field sufficiently.

For instance, it is preferable that the thickness T1 be 0.1 mm or more and 5 mm or less, the inner diameter D1 of the first cylindrical part 31 be 18 mm or more and 70 mm or less, the inner diameter D2 of the second cylindrical part 32 be 18 mm or more and 100 mm or less, the height H1 of the first cylindrical part 31 be 0.3 mm or more and 30 mm or less, and the height H2 of the second cylindrical part 32 be 1 mm or more and 100 mm or less.

The second shield member 40 may be disposed between the shaping aperture array substrate 10 and the blanking aperture array substrate 20. In addition, the third shield member 50 may be disposed between the blanking aperture array substrate 20 and the first shield member 30.

Figure 4:
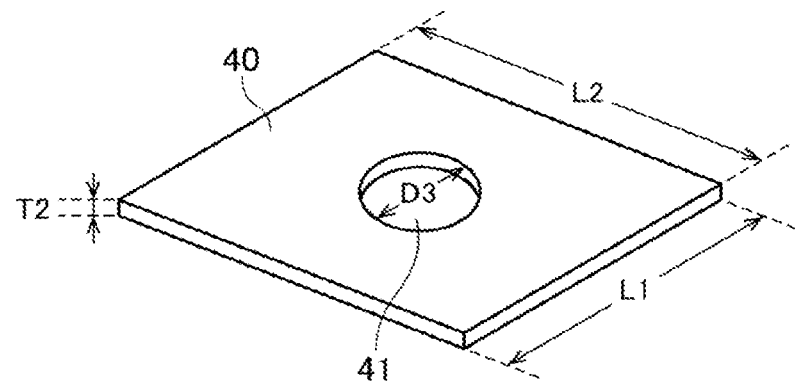
FIG. 4 is a perspective view of a second shield member.

As illustrated in FIG. 4, in the second shield member 40, an opening 41 for passage of the multi-beam MB is formed in a central portion of a flat rectangular plate in a plan view. Diameter D3 of the opening 41 is approximately equal to the inner diameter D1 of the first cylindrical part 31 of the first shield member 30.

Lengths L1, L2 of the sides of the second shield member 40 are not particularly limited, and may be such that they do not interfere with the parts in the column. Thickness T2 of the second shield member 40 is approximately equal to the thickness T1 of the first shield member 30.

For instance, it is preferable that the thickness T2 be 0.1 mm or more and 5 mm or less, the lengths L1, L2 be 23 mm or more and 140 mm or less, and the inner diameter D3 be 22.6 mm or more and 50 mm or less.

Figure 5:
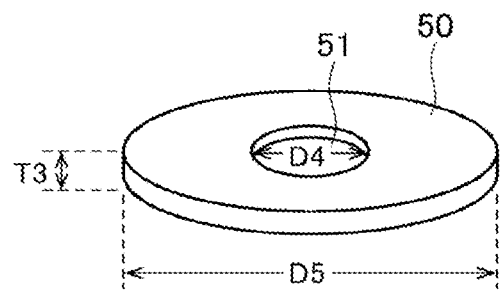
FIG. 5 is a perspective view of a third shield member.

As illustrated in FIG. 5, the third shield member 50 has an annular shape in which an opening 51 for passage of the multi-beam MB is formed in a central portion of a flat circular plate. Inner diameter D4 of the opening 51 is approximately equal to the inner diameter D1 of the first cylindrical part 31 of the first shield member 30.

Outer diameter D5 of the third shield member 50 is not particularly limited, and desirably has the length until the end of a power supply plane of the blanking aperture array substrate 20, for instance. A magnetic field between the blanking aperture array substrate 20 and the first shield member 30 can be shielded to prevent the magnetic field from spreading. Thickness T3 of the third shield member 50 is approximately equal to the thickness T1 of the first shield member 30.

For instance, it is preferable that the thickness T3 be 0.1 mm or more and 5 mm or less, the inner diameter D4 be 23 mm or more and 50 mm or less, and the outer diameter D5 be 24 mm or more and 100 mm or less.

In the writing apparatus 100 with such shield member S installed as illustrated in FIG. 1, the electron beam B discharged from the electron gun 111 (discharge unit) passes through the reducing lens 115 substantially perpendicularly by the illuminating lens 112, and illuminates the entire shaping aperture array substrate 10 while being reduced in entire beam shape. However, the reducing lens 115 may be provided downstream of the blanking aperture array substrate 20.

The electron beam 130 passes through the plurality of openings 12 of the shaping aperture array substrate 10, thereby forming the multi-beam MB including a plurality of electron beams. The multi-beam MB passes through the openings 41 of the second shield member 40, and passes between corresponding blankers of the blanking aperture array substrate 20.

The multi-beam MB which has passed through the blanking aperture array substrate 20, passes through the opening 51 of the third shield member 50, and subsequently passes through inside the first cylindrical part 31 and the second cylindrical part 32 of the first shield member 30.

The multi-beam MB which has passed through the first shield member 30 travels to an opening at the center of the limiting aperture member 116 through the overall blanker 119 for collectively turning off the beams while being reduced in entire beam shape. An electron beam deflected by a blanker of the blanking aperture array substrate 20 is displaced from the opening at the center of the limiting aperture member 116, and is shielded by the limiting aperture member 116. In contrast, an electron beam not deflected by a corresponding blanker passes through the opening at the center of the limiting aperture member 116. Blanking control is performed by on/off of each blanker and the overall blanker, thus on/off of each beam is controlled.

In this manner, the limiting aperture member 116 shields each of the beams deflected by a plurality of blankers to achieve a beam-off state. The beam for one shot is formed by the beam which has passed through the limiting aperture member 116 during a time from beam on to beam off.

The multi-beam which has passed through the limiting aperture member 116 is focused by the object lens 117, and forms a pattern image with a desired reduction ratio. The entire multi-beam is collectively deflected by the deflector 118 in the same direction, and is radiated to respective irradiation positions of the beams on the sample 101. When the XY stage 105 is continuously moved, the beams are controlled by the deflector 118 so that the irradiation positions of the beams follow the movement of the XY stage 105.

The multi-beams radiated at one time are ideally arranged with the pitch which is the product of the arrangement pitch of the plurality of openings 12 of the shaping aperture array substrate 10 and the above-mentioned desired reduction ratio. The writing apparatus 100 performs a writing operation by a raster scan method for irradiating with a shot beam sequentially, and when a desired pattern is written, an unnecessary beam is controlled at a beam-off by the blanking control.

Figure 6:
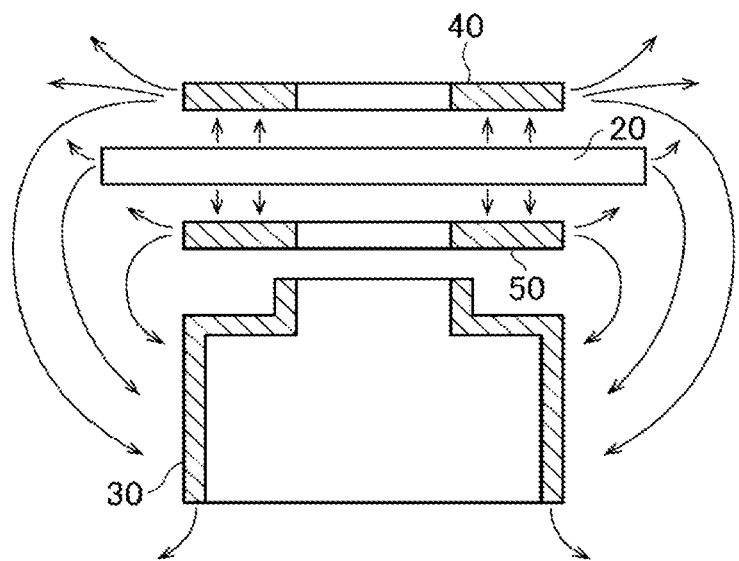
FIG. 6 is a schematic view of magnetic field absorption by the shield members.

A magnetic field is generated by a current which flows through a control circuit of the blanking aperture array substrate 20 that performs blanking control. As illustrated by arrows of FIG. 6, the generated magnetic field is absorbed by the first shield member 30, the second shield member 40 and the third shield member 50 which are disposed in the vicinity of the blanking aperture array substrate 20, and is released from their ends. Therefore, the magnetic field can be released to the outside of the trajectory of the multi-beam. Because a magnetic field is also released from the inner diameter portion of each shield member, the beam is slightly deflected. However, the beam irradiation position on the surface of the sample 101 is designed based on experimental results, and a simulation result after creating a mounting substrate model in order to minimize the accumulated deflection amount on the surface of the sample 101, in other words, in a range capable of coping with by a correction technique. Thus, the effect of the magnetic field is minor.

In addition, a magnetic field can also be generated from the reducing lens 115. However, the magnetic field is absorbed by the second shield member 40 disposed above of the blanking aperture array substrate 20, and is released to the outside of the trajectory of the multi-beam.

In this manner, in the embodiment, the magnetic field is shielded by providing the shield member S, and the magnetic field can be released to the outside of the trajectory of the multi-beam. Thus, the magnetic field is prevented from entering and affecting the trajectory of the multi-beam. Consequently, it is possible to prevent the trajectory of the beam from bending and the beam irradiation position on the sample surface from being displaced, thus writing with high accuracy can be achieved.

Figure 7:
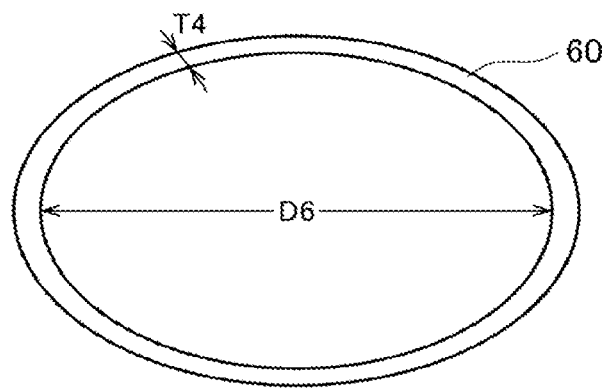
FIG. 7 is a perspective view of a fourth shield member.

A ring-shaped fourth shield member 60 as illustrated in FIG. 7 may be further disposed between the blanking aperture array substrate 20 and the third shield member 50. The fourth shield member 60 is manufactured with a high magnetic permeability material, its inner diameter D6 is approximately equal to the inner diameter D1 of the first cylindrical part 31 of the first shield member 30, and thickness T4 is approximately equal to the thickness T1 of the first shield member 30.

In the embodiment, the configuration has been described, in which a rectangular flat plate having a circular opening is used for the second shield member 40 and a circular flat plate having a circular opening is used for the third shield member 50. However, the outer shape of the flat plate is not limited to rectangle or circle, and may be a triangle or a polygon having five or more sides, and may be any shape which does not interfere with the parts in the column. A circular flat plate having a circular opening may be used for the second shield member 40. In this case, the thickness, the outer diameter, and the inner diameter of the second shield member 40 may be substantially the same as those of the third shield member 50.

In the embodiment, the first shield member 30 has been described, in which the first cylindrical part 31 and the second cylindrical part 32 are connected. However, when the first shield member 30 can be disposed sufficiently close to the blanking aperture array substrate 20, the first shield member 30 may have a cylindrical shape with a uniform diameter.

In the writing apparatus of the embodiment, the overall blanker 119 deflects the entire multi-beam, thus the overall blanker 119 needs to be provided above the limiting aperture member 116 with a certain distance. In contrast, the first shield member 30 needs to have a certain length to prevent the magnetic field from entering the trajectory of the multi-beam. In the embodiment, in order to satisfy both requirements for the position of the overall blanker 119 and the length of the first shield member 30, based on the restriction on the size of the electron column 102, the first shield member 30 has a configuration in which the first cylindrical part 31 and the second cylindrical part 32 having an inner diameter greater than the first cylindrical part 31 are connected, and the overall blanker 119 is disposed inside the second cylindrical part 32.

The shield members may be connected to each other with a high magnetic permeability material. At this point, the shield members may be connected via a connection member.

In each of the shield members, the shape of the opening for the beam passage is preferably circular to reduce the effect of aberration and distortion on the beam.

Figure 8:
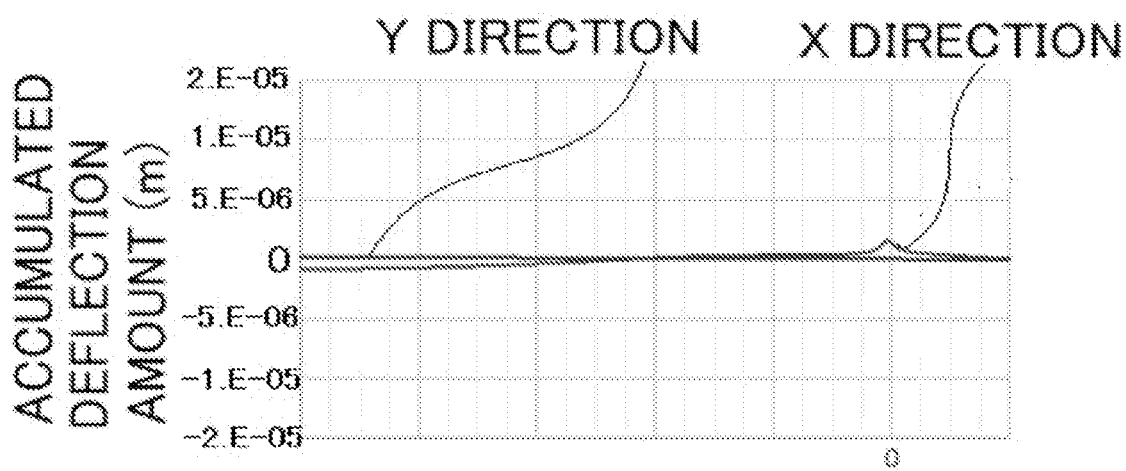
FIG. 8 is a graph illustrating a simulation result of accumulated deflection amount.

FIG. 8 illustrates a simulation result of accumulated deflection amount of the beam when the first shield member 30 and the third shield member 50 are installed. In the simulation, Femtet (manufactured by Murata Software Co., Ltd) was used as an analysis software, and the current paths of power supply layers were modeled from the circuit layout of the blanking aperture array substrate 20 (the blanking aperture array chip and its mounting substrate). In addition, the reducing lens 115 capable of absorbing the magnetic field from the control circuit of the blanking aperture array substrate was also modeled, and the inside of the actual electron column 102 was simply modeled.

The current which flowed through the blanking aperture array substrate 20 in the actual writing apparatus was measured, and a current density distribution was calculated using the measured current value to determine the accumulated deflection amount.

The vertical axis of the graph illustrated in FIG. 8 indicates accumulated deflection amount, and the horizontal axis thereof indicates position in the height direction (Z-direction). Z=0 corresponds to the position of the blanking aperture array substrate 20. It is seen from the simulation result illustrated in FIG. 8 that the accumulated deflection amount is controlled at a very low level.

While certain embodiments have been described, these embodiments have been presented by way of example only, and are not intended to limit the scope of the inventions. For example, although the above embodiments employ the variable formation beam that is shaped at each shot and is irradiated, a beam having a definite shape may be irradiated. A plurality of beams can be irradiated simultaneously. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
    a blanking aperture array substrate provided with a plurality of blankers configured to respectively perform blanking deflection on a plurality of charged particle beams included in a multi-beam; and
    a first shield member which is disposed downstream of the blanking aperture array substrate with respect to a travel direction of the multi-beam, has a cylindrical part in which the multi-beam passes through, and is composed of a high magnetic permeability material.

2. The apparatus according to claim 1,
    wherein the first shield member is connected to other shield members directly or via a connection member composed of a high magnetic permeability material.

3. The apparatus according to claim 1, further comprising
    a flat plate-shaped second shield member which is disposed upstream of the blanking aperture array substrate with respect to the travel direction of the multi-beam, has a circular opening through which the multi-beam passes, and is composed of a high magnetic permeability material.

4. The apparatus according to claim 3,
    wherein in the second shield member, the circular opening is formed in a central portion of a flat rectangular plate in a plan view, and
    a length of one side of the rectangular plate is 23 mm or more and 140 mm or less, and a diameter of the circular opening is 22.6 mm or more and 50 mm or less.

5. The apparatus according to claim 3,
    wherein the second shield member has an annular shape.

6. The apparatus according to claim 5,
    wherein a thickness of the second shield member is 0.1 mm or more and 5 mm or less, an inner diameter is 23 mm or more and 50 mm or less, and an outer diameter is 24 mm or more and 100 mm or less.

7. The apparatus according to claim 3, further comprising
    a shaping aperture array substrate including a plurality of openings, and configured to form the multi-beam by allowing parts of a charged particle beam to pass through the plurality of openings,
    wherein the second shield member is disposed between the shaping aperture array substrate and the blanking aperture array substrate.

8. The apparatus according to claim 1, further comprising
    a flat plate-shaped third shield member which is disposed between the blanking aperture array substrate and the first shield member, has a circular opening through which the multi-beam passes, and is composed of a high magnetic permeability material.

9. The apparatus according to claim 8,
    wherein the third shield member has an annular shape.

10. The apparatus according to claim 9,
    wherein a thickness of the third shield member is 0.1 mm or more and 5 mm or less, an inner diameter is 23 mm or more and 50 mm or less, and an outer diameter is 24 mm or more and 100 mm or less.

11. The apparatus according to claim 8, further comprising
    a ring-shaped fourth shield member which is disposed between the blanking aperture array substrate and the third shield member, and composed of a high magnetic permeability material.

12. The apparatus according to claim 1,
    wherein the first shield member has a first cylindrical part, and a second cylindrical part having an inner diameter greater than an inner diameter of the first cylindrical part, and a lower edge of the first cylindrical part and an upper edge of the second cylindrical part are connected.

13. The apparatus according to claim 12,
wherein a thickness of the first shield member is 0.1 mm or more and 5 mm or less, an inner diameter of the first cylindrical part is 18 mm or more and 70 mm or less, a height of the first cylindrical part is 0.3 mm or more and 30 mm or less, and a height of the second cylindrical part is 1 mm or more and 100 mm or less.

14. The apparatus according to claim 1,
wherein the first shield member is composed of alloy containing iron, nickel or cobalt which have a relative magnetic permeability of 1 or more.

15. The apparatus according to claim 14,
wherein the first shield member is composed of permalloy.

16. The apparatus according to claim 3, further comprising:
a flat plate-shaped third shield member which is disposed between the blanking aperture array substrate and the first shield member, has a circular opening through which the multi-beam passes, and is composed of a high magnetic permeability material; and
a ring-shaped fourth shield member which is disposed between the blanking aperture array substrate and the third shield member, and is composed of a high magnetic permeability material.

* * * * *